United States Patent
Watanabe et al.

(10) Patent No.: US 12,507,504 B2
(45) Date of Patent: Dec. 23, 2025

(54) GROUP III NITRIDE SEMICONDUCTOR LIGHT-EMITTING ELEMENT AND METHOD OF MANUFACTURING SAME

(71) Applicant: DOWA Electronics Materials Co., Ltd., Tokyo (JP)

(72) Inventors: Yasuhiro Watanabe, Tokyo (JP); Takehiko Fujita, Tokyo (JP)

(73) Assignee: DOWA Electronics Materials Co., Ltd., Tokyo (JP)

( * ) Notice: Subject to any disclaimer, the term of this patent is extended or adjusted under 35 U.S.C. 154(b) by 313 days.

(21) Appl. No.: 17/176,181

(22) Filed: Feb. 16, 2021

(65) Prior Publication Data

US 2021/0193874 A1 Jun. 24, 2021

Related U.S. Application Data

(63) Continuation of application No. 16/568,716, filed on Sep. 12, 2019, now Pat. No. 11,024,769, which is a
(Continued)

(30) Foreign Application Priority Data

Jul. 30, 2015 (JP) .................................. 2015-151052

(51) Int. Cl.
*H10H 20/812* (2025.01)
*H10H 20/01* (2025.01)
(Continued)

(52) U.S. Cl.
CPC ...... *H10H 20/812* (2025.01); *H10H 20/0137* (2025.01); *H10H 20/816* (2025.01);
(Continued)

(58) Field of Classification Search
CPC .. H10H 20/01; H10H 20/0137; H10H 20/812; H10H 20/816; H10H 20/825;
(Continued)

(56) References Cited

U.S. PATENT DOCUMENTS

2003/0232457 A1\* 12/2003 Kawaguchi ......... H01L 21/0254
438/46
2006/0108603 A1\* 5/2006 Uemura ................. B82Y 20/00
257/194
(Continued)

FOREIGN PATENT DOCUMENTS

EP 2701210 A2 2/2014
JP 2002151795 A 5/2002
(Continued)

OTHER PUBLICATIONS

Akira Fujioka et al., "Improvement in Output Power of 280-nm Deep Ultraviolet Light-Emitting Diode by Using AlGaN Multi Quantum Wells", Applied Physics Express 3, 2010, 041001, pp. 1-3, The Japan Society of Applied Physics.
(Continued)

*Primary Examiner* — Britt Hanley
*Assistant Examiner* — Kevin Quinto
(74) *Attorney, Agent, or Firm* — KENJA IP LAW PC

(57) ABSTRACT

A group III nitride semiconductor light-emitting element comprises, in the following order: an n-type group III nitride semiconductor layer; a group III nitride semiconductor laminated body obtained by alternately laminating a barrier layer and a well layer narrower in bandgap than the barrier layer in the stated order so that the number of barrier layers and the number of well layers are both N, where N is an integer; an AlN guide layer; and a p-type group III nitride semiconductor layer. The AlN guide layer has a thickness of 0.7 nm or more and 1.7 nm or less. A final barrier layer wider
(Continued)

in bandgap than the well layer and narrower in bandgap than the AlN guide layer is provided between an Nth well layer in the group III nitride semiconductor laminated body and the AlN guide layer.

12 Claims, 7 Drawing Sheets

Related U.S. Application Data continuation of application No. 15/748,620, filed as application No. PCT/JP2016/003021 on Jun. 22, 2016, now Pat. No. 10,573,783.

(51) Int. Cl.
 *H10H 20/816* (2025.01)
 *H10H 20/825* (2025.01)
 *H10H 20/83* (2025.01)

(52) U.S. Cl.
 CPC ........ *H10H 20/8252* (2025.01); *H10H 20/83* (2025.01); *H10H 20/825* (2025.01)

(58) Field of Classification Search
 CPC .. H10H 20/8252; H10H 20/83; H01L 33/005; H01L 33/0075; H01L 33/06; H01L 33/14; H01L 33/32; H01L 33/325; H01L 33/36
 See application file for complete search history.

(56) References Cited

U.S. PATENT DOCUMENTS

| | | | |
|---|---|---|---|
| 2010/0219395 A1 | 9/2010 | Hirayama et al. | |
| 2014/0054542 A1* | 2/2014 | Han | H10H 20/815 257/13 |
| 2014/0103289 A1* | 4/2014 | Liao | H01L 33/007 438/46 |
| 2014/0209857 A1 | 7/2014 | Takano et al. | |

FOREIGN PATENT DOCUMENTS

| | | |
|---|---|---|
| JP | 2005209925 A | 8/2005 |
| JP | 2010205767 A | 9/2010 |
| JP | 2013239608 A | 11/2013 |
| JP | 2014180819 A | 9/2014 |
| JP | 2014241397 A | 12/2014 |
| WO | 2012144046 A1 | 10/2012 |
| WO | 2014123092 A1 | 8/2014 |

OTHER PUBLICATIONS

Akira Fujioka et al., Improvement in Output Power of 280-nm Deep Ultraviolet Light-Emitting Diode by Using AlGaN Multi Quantum Wells, Applied Physics Express, 2010, pp. 041001-1 to 041001-3, vol. 3.
Aug. 2, 2016, International Search Report issued in the International Patent Application No. PCT/JP2016/003021.
Dec. 16, 2019, Office Action issued by the Korean Intellectual Property Office in the corresponding Korean Patent Application No. 10-2018-7002002.
Dec. 2, 2020, Office Action issued by the China National Intellectual Property Administration in the corresponding Chinese Patent Application No. 201680043718.6.
Dec. 26, 2017, Notification of Reasons for Revocation issued by the Japan Patent Office in the corresponding Japanese Patent No. 6092961.
Jan. 30, 2018, International Preliminary Report on Patentability issued in the International Patent Application No. PCT/JP2016/003021.
Jul. 1, 2020, Office Action issued by the China National Intellectual Property Administration in the corresponding Chinese Patent Application No. 201680043718.6.
Jul. 26, 2016, Notification of Reasons for Refusal issued by the Japan Patent Office in the corresponding Japanese Patent Application No. 2015-151052.
Mar. 15, 2018, Ruling on the Patent Opposition issued by the Japan Patent Office in the corresponding Japanese Patent No. 6092961.
May 15, 2019, Office Action issued by the Korean Intellectual Property Office in the corresponding Korean Patent Application No. 10-2018-7002002.
May 20, 2020, Office Action issued by the Korean Intellectual Property Office in the corresponding Korean Patent Application No. 10-2018-7002002.
Nov. 7, 2018, Communication pursuant to Rule 114(2) EPC issued by the European Patent Office in the corresponding European Patent Application No. 16830000.2.
Nov. 8, 2016, Notification of Reasons for Refusal issued by the Japan Patent Office in the corresponding Japanese Patent Application No. 2015-151052.
Oct. 23, 2018, the Extended European Search Report issued by the European Patent Office in the corresponding European Patent Application No. 16830000.2.
Oct. 24, 2018, Communication pursuant to Rule 114(2) EPC issued by the European Patent Office in the corresponding European Patent Application No. 16830000.2.
Oct. 9, 2019, Office Action issued by the China National Intellectual Property Administration in the corresponding Chinese Patent Application No. 201680043718.6.
Shigeaki Sumiya et al., "AlGaN-Based Deep Ultraviolet Light-Emitting Diodes Grown on Epitaxial AlN/Sapphire Templates", Japanese Journal of Applied Physics, 2008, pp. 43-46, vol. 47, No. 1, The Japan Society of Applied Physics.
Apr. 8, 2021, Office Action issued by the China National Intellectual Property Administration in the corresponding Chinese Patent Application No. 201680043718.6.

\* cited by examiner

Step 4A

Step 4B

Step 4C  ⇩ HEAT TREATMENT

Step 4D

Step 4E

Step 4F

Step 4G

Step 4H

Step 4I

Step 5A

Step 5B

Step 5C

GROUP III NITRIDE SEMICONDUCTOR LIGHT-EMITTING ELEMENT AND METHOD OF MANUFACTURING SAME

CROSS-REFERENCE TO RELATED APPLICATION

This application is a continuation of U.S. application Ser. No. 16/568,716 filed Sep. 12, 2019, which is a continuation of U.S. application Ser. No. 15/748,620 filed Jan. 29, 2018, which is a National Stage Application of PCT/JP2016/003021 filed Jun. 22, 2016, which claims priority based on Japanese Patent Application No. 2015-151052 filed Jul. 30, 2015. The disclosures of the prior applications are hereby incorporated by reference herein in their entirety.

TECHNICAL FIELD

This disclosure relates to a group III nitride semiconductor light-emitting element and a method of manufacturing the same. This disclosure particularly relates to a group III nitride semiconductor light-emitting element having both excellent element life and excellent light output, and a method of manufacturing the same.

BACKGROUND

Group III nitride semiconductors composed of a compound of N and group III elements such as Al, Ga, and In have conventionally been used as material of light-emitting elements from blue light to deep ultraviolet light. In particular, group III nitride semiconductors composed of AlGaN with a high Al composition have been used in ultraviolet light-emitting elements with an emission wavelength of 340 nm or less and deep ultraviolet light-emitting elements (DUV-LED) with an emission wavelength of 300 nm or less.

It has been commonly considered that a deep ultraviolet light-emitting element using a group III nitride semiconductor has very low light extraction efficiency and so is difficult to achieve higher output. However, to provide a small and high-output deep ultraviolet light-emitting element, various attempts to achieve high external quantum efficiency, low resistance, and the like have been made.

For example, we previously proposed the following light-emitting element in JP 2010-205767 A (PTL 1). A light-emitting element formed on an AlN-based group III nitride single crystal includes: a high-concentration n-type group III nitride layer; a multiple quantum well structure composed of an n-type or i-type group III nitride barrier layer and an n-type or i-type group III nitride well layer; an i-type group III nitride final barrier layer; a p-type group III nitride layer; and an electron block layer formed between the i-type group III nitride final barrier layer and the p-type group III nitride layer and composed of a p-type or i-type $Al_zGa_{1-z}N$ layer ($0.95 < z \leq 1$) that serves as an electron energy barrier for the i-type group III nitride final barrier layer.

With the technique described in PTL 1, internal quantum efficiency is improved by optimizing the quantum well thickness of the quantum well structure, and electron injection efficiency is optimized by introducing and optimizing the electron block layer and optimizing the final barrier layer.

CITATION LIST

Patent Literature

PTL 1: JP 2010-205767 A

SUMMARY

Technical Problem

The technique described in PTL 1 can enhance luminous efficiency in an ultraviolet light-emitting element using a group III nitride semiconductor. However, not only improved luminous efficiency but also improved element life of the group III nitride semiconductor light-emitting element is desired, and there is still room for improvement in terms of life.

It could therefore be helpful to provide a group III nitride semiconductor light-emitting element having both excellent element life and excellent light output, and a method of manufacturing the same.

Solution to Problem

Upon conducting keen examination, we considered that carrier leakage from a light-emitting layer causes short life, and focused attention on a layer structure between a laminated body formed by laminating a barrier layer and a well layer and a p-type semiconductor layer and the thickness of the layer structure. We then discovered that, by providing an AlN guide layer having appropriate thickness between the laminated body and the p-type semiconductor layer, the life of the group III nitride semiconductor light-emitting element can be greatly improved, and also excellent light output can be achieved.

We thus provide:
(1) A group III nitride semiconductor light-emitting element comprising, in the following order: an n-type group III nitride semiconductor layer; a group III nitride semiconductor laminated body obtained by alternately laminating a barrier layer and a well layer narrower in bandgap than the barrier layer in the stated order so that the number of barrier layers and the number of well layers are both N, where N is an integer; an AlN guide layer; and a p-type group III nitride semiconductor layer, wherein the AlN guide layer has a thickness of 0.5 nm or more and 2.0 nm or less.
(2) The group III nitride semiconductor light-emitting element according to (1), wherein the AlN guide layer is i-type.
(3) The group III nitride semiconductor light-emitting element according to (1) or (2), wherein an Nth well layer in the group III nitride semiconductor laminated body and the AlN guide layer are in contact with each other, or a final barrier layer wider in bandgap than the well layer and narrower in bandgap than the AlN guide layer is provided between the Nth well layer in the group III nitride semiconductor laminated body and the AlN guide layer, the final barrier layer having a thickness of 1.5 nm or less.
(4) The group III nitride semiconductor light-emitting element according to (3), wherein the final barrier layer has a thickness of 0.1 nm or more and 1.0 nm or less.
(5) The group III nitride semiconductor light-emitting element according to any one of (1) to (4), wherein the AlN guide layer has a thickness of more than 0.5 nm and less than 2.0 nm.

(6) The group III nitride semiconductor light-emitting element according to any one of (1) to (5), wherein the p-type group III nitride semiconductor layer includes a first p-type group III nitride semiconductor layer and a second p-type group III nitride semiconductor layer in the stated order, the first p-type group III nitride semiconductor layer is narrower in bandgap than the AlN guide layer, and wider in bandgap than the barrier layer, and the second p-type group III nitride semiconductor layer is narrower in bandgap than the first p-type group III nitride semiconductor layer.

(7) The group III nitride semiconductor light-emitting element according to (6), wherein the first p-type group III nitride semiconductor layer and the second p-type group III nitride semiconductor layer are in contact with each other, and the second p-type group III nitride semiconductor layer is composed only of a p-type contact layer.

(8) A method of manufacturing a group III nitride semiconductor light-emitting element, the method comprising: a first step of forming an n-type group III nitride semiconductor layer; a second step of forming, on the n-type group III nitride semiconductor layer, a group III nitride semiconductor laminated body obtained by alternately laminating a barrier layer and a well layer narrower in bandgap than the barrier layer in the stated order so that the number of barrier layers and the number of well layers are both N, where N is an integer; a third step of forming an AlN guide layer having a thickness of 0.5 nm or more and 2.0 nm or less, on the group III nitride semiconductor laminated body; and a fourth step of forming a p-type group III nitride semiconductor layer on the AlN guide layer, wherein, in the third step, the AlN guide layer is epitaxially grown using source gas including trimethylaluminum gas and ammonia gas.

(9) A method of manufacturing a group III nitride semiconductor light-emitting element, the method comprising: a first step of forming an n-type group III nitride semiconductor layer; a second step of forming, on the n-type group III nitride semiconductor layer, a group III nitride semiconductor laminated body obtained by alternately laminating a barrier layer and a well layer narrower in bandgap than the barrier layer in the stated order so that the number of barrier layers and the number of well layers are both N, where N is an integer; a third step of forming an AlN guide layer having a thickness of 0.5 nm or more and 2.0 nm or less, on the group III nitride semiconductor laminated body; and a fourth step of forming a p-type group III nitride semiconductor layer on the AlN guide layer, wherein, in the third step, (i) an AlGaN alteration layer is epitaxially grown using source gas including trimethylaluminum gas, trimethylgallium gas, and ammonia gas; (ii) supply of the trimethylaluminum gas and the trimethylgallium gas is then stopped to interrupt the epitaxial growth; and (iii) the AlGaN alteration layer is exposed to a carrier gas atmosphere having hydrogen as a main component, to at least partially remove and alter the AlGaN alteration layer to the AlN guide layer, and cause a remaining part of the AlGaN alteration layer to be a final barrier layer.

(10) The method of manufacturing a group III nitride semiconductor light-emitting element according to (9), wherein, in the third step, the whole AlGaN alteration layer is altered to the AlN guide layer.

(11) The method of manufacturing a group III nitride semiconductor light-emitting element according to any one of (8) to (10), wherein the AlN guide layer is i-type.

Advantageous Effect

By providing an AlN guide layer having appropriate thickness, a group III nitride semiconductor light-emitting element having longer element life than conventional group III nitride semiconductor light-emitting elements and a method of manufacturing the same can be provided.

DETAILED DESCRIPTION (Group III Nitride Semiconductor Light-Emitting Element) Embodiments of this disclosure are described below, with reference to drawings. The same structural elements are basically given the same reference signs, and their description is omitted. In each drawing, the aspect ratio of each of the substrate and the layers is exaggerated for purposes of illustration.

Figure 1:
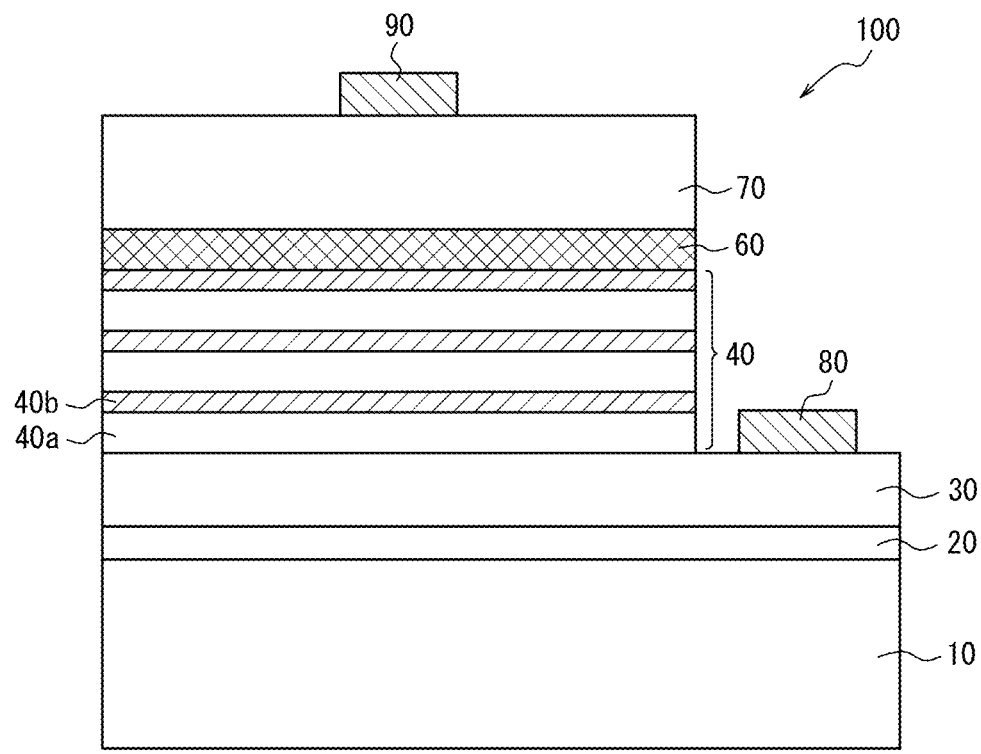
FIG. 1 is a schematic sectional diagram illustrating a group III nitride semiconductor light-emitting element according to an embodiment of this disclosure.

As illustrated in FIG. 1, a group III nitride semiconductor light-emitting element 100 according to an embodiment of this disclosure includes: an n-type group III nitride semiconductor layer 30; a group III nitride semiconductor laminated body 40 obtained by alternately laminating a barrier layer 40a and a well layer 40b narrower in bandgap than the barrier layer 40a in this order so that the number of barrier layers 40a and the number of well layers 40b are both N (where N is an integer); an AlN guide layer 60; and a p-type group III nitride semiconductor layer 70, in this order. The AlN guide layer 60 has a thickness of 0.5 nm or more and 2.0 nm or less. Hereafter, the n-type group III nitride semiconductor layer 30 is simply referred to as "n layer 30", the group III nitride semiconductor laminated body 40 as "laminated body 40", and the p-type group III nitride semiconductor layer 70 as "p layer 70".

The n layer 30 of the group III semiconductor light-emitting element 100 can be provided on an AlN template substrate formed by providing an AlN layer 20 on the surface of a substrate 10, as illustrated in FIG. 1. Moreover, the group III semiconductor light-emitting element 100 may be provided with: an n-type electrode 80 formed on the n layer 30 exposed by removing part of the laminated body 40, the AlN guide layer 60, and the p layer 70 by etching or the like; and a p-type electrode 90 formed on the player 70. In the group III semiconductor light-emitting element 100 according to this embodiment, the n layer 30, the laminated body 40, the AlN guide layer 60, the p layer 70, and an optional final barrier layer 50 (FIG. 2) have characteristic structures, and particularly the laminated body 40 and the AlN guide layer 60 have characteristic structures. The substrate 10, the AlN layer 20, the n-type electrode 80, and the p-type electrode 90 may have typical structures, and are not limited to any specific structures. A buffer layer that is one or more selected from an AlGaN layer, a composition inclined layer, and a superlattice layer may be provided between the AlN layer 20 and the n layer 30, although not illustrated. The n layer 30, the laminated body 40, the AlN guide layer 60, and the p layer 70 having characteristic structures in this disclosure are described below.

The n layer 30 is a group III nitride semiconductor layer containing at least Al, and may be a typical n-type semiconductor layer as long as it constitutes a pn junction in the group III nitride semiconductor light-emitting element 100. The n layer 30 may be made of, for example, an AlGaN material, and may contain 5% or less In with respect to Al and Ga as group III elements. The n layer 30 is doped with an n-type dopant (impurity). Examples of the n-type dopant include Si, Ge, Sn, S, O, Ti, and Zr. The dopant concentration is not limited as long as it enables functioning as n-type. For example, the dopant concentration may be $1.0 \times 10^{18}$ atoms/cm$^3$ to $1.0 \times 10^{20}$ atoms/cm$^3$. The Al content ratio of the n layer 30 is not limited, and may be in a typical range. The n-type semiconductor layer 30 may be composed of a single layer or a plurality of layers. The composition and thickness of a laminated body 40 side portion of the n layer 30 may be adjusted as appropriate so that the laminated body 40 side portion of the n layer 30 also functions as the barrier layer 40a. In such a case, it is assumed that one barrier layer 40a is formed.

In the group III nitride semiconductor light-emitting element 100, the laminated body 40 is provided following the n layer 30. The laminated body 40 is obtained by alternately laminating the barrier layer 40a and the well layer 40b narrower in bandgap than the barrier layer 40a in this order so that the number of barrier layers 40a and the number of well layers 40b are both N (where N is an integer). For example, AlGaN materials different in Al composition may be used as the barrier layer 40a and the well layer 40b. The barrier layer 40a and the well layer 40b may be an AlGaInN material or the like by introducing a group III element such as In with a composition ratio of 5% or less, according to need. However, the barrier layer 40a and the well layer 40b are more preferably a ternary AlGaN material using only Al and Ga as group III elements. Each layer in the laminated body 40 may be any of n-type and i-type. The barrier layer is, however, preferably n-type, because it has an effect of increasing the electron concentration and compensating for crystal defects in the well layer. The laminated body 40 can be regarded as being obtained by removing, from a typical multiple quantum well (MQW) structure formed by alternating a barrier layer and a well layer with the barrier layer being situated outermost on both sides, the last barrier layer on the p layer side.

In the case where an $Al_aGa_{1-a}N$ material is used as the barrier layer 40a and an $Al_bGa_{1-b}N$ material is used as the well layer 40b, for example, the Al composition a of the barrier layer 40a may be 0.40 to 0.95, and the Al composition b of the well layer 40b may be 0.30 to 0.80 (where a>b). Moreover, the layer number N of each of the barrier layers 40a and the well layers 40b may be, for example, 1 to 10. The thickness of the barrier layer 40a may be 3 nm to 30 nm, and the thickness of the well layer 40b may be 0.5 nm to 5 nm.

If the Al composition b of the well layer 40b in the laminated body 40 is 0.35 or more, the center wavelength of light emitted from the laminated body 40 is 300 nm or less, so that the group III nitride semiconductor light-emitting element 100 as a final product can be used as a DUV-LED.

In the group III nitride semiconductor light-emitting element 100, the AlN guide layer 60 is provided following the laminated body 40. The AlN guide layer 60 is most preferably a nitride semiconductor layer made of AlN formed with the group III element Al composition ratio being 100%. However, in view of the possibility of inevitable intrusion of other group III elements (such as Ga) during the manufacturing process and the generation of gas upon alteration and the state of progress of the alteration, the AlN guide layer 60 is defined as a layer with an eventual Al composition ratio of 96% to 100%. The thickness of the AlN guide layer 60 is 0.5 nm or more and 2.0 nm or less. The technical significance of limiting the AlN guide layer 60 to this thickness range will be described later. The AlN guide layer 60 is preferably undoped, but may be doped with a p-type dopant such as Mg or an n-type dopant such as Si. The AlN guide layer 60 need not have a uniform impurity concentration. For example, the impurity concentration may differ between the laminated body 40 side and the p layer 70 side of the AlN guide layer 60. In the case where a dopant is added, the AlN guide layer 60 may end up being not only i-type but also partially or wholly p-type or n-type.

Here, "i-type" denotes a layer (also referred to as "undoped layer") to which no specific impurity is deliberately added. Although a semiconductor containing no impurity at all is ideal, any semiconductor that does not electrically function as any of p-type and n-type is applicable, and a semiconductor with low carrier density (e.g. less than $5 \times 10^{16}$/cm$^3$) can be regarded as i-type. Even if p-type dopant diffusion from the p layer 70 occurs, it does not mean any specific impurity is deliberately added.

Figure 2:
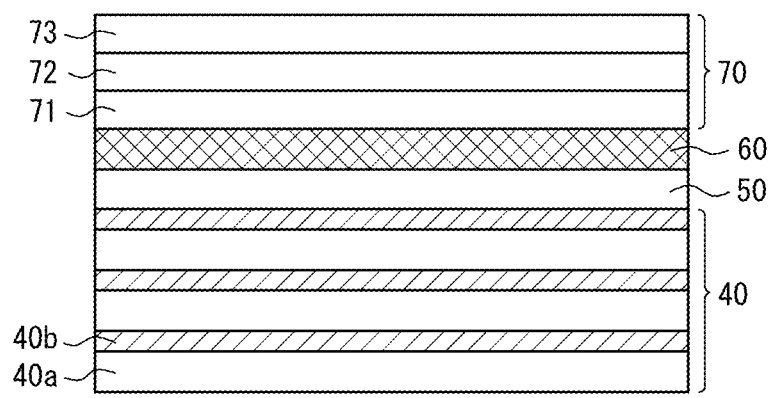
FIG. 2 is a schematic sectional diagram illustrating a laminated body, a final barrier layer, an AlN guide layer, and a p-type semiconductor layer in a group III nitride semiconductor light-emitting element according to another embodiment of this disclosure.

The p layer 70 provided following the AlN guide layer 60 is not limited as long as it can inject holes into the laminated body 40, and may have a typical structure. As illustrated in FIG. 2, the p layer 70 may include any one or more (multilayer structure) of a p-type electron block layer 71, a p-type clad layer 72, and a p-type contact layer 73 using AlGaN materials different in Al composition ratio (described in detail later). Examples of a p-type dopant with which the p layer 70 is doped include Mg, Zn, Ca, Be, and Mn. The average dopant concentration of the whole p layer 70 is not limited as long as the p layer 70 can function as p-type. For example, the average dopant concentration may be $1.0 \times 10^{18}$ atoms/cm$^3$ to $5.0 \times 10^{21}$ atoms/cm$^3$. The p layer 70 in this embodiment may or may not include the p-type clad layer 72 (described later).

A particular feature in this disclosure is that the AlN guide layer 60 having the appropriate thickness is provided on the p layer 70 side of the laminated body 40 in the group III nitride semiconductor light-emitting element 100. Our experiments revealed that providing the AlN guide layer 60 can improve the element life of the group III nitride semiconductor light-emitting element 100 (described in detail later in the examples).

Figure 3A:
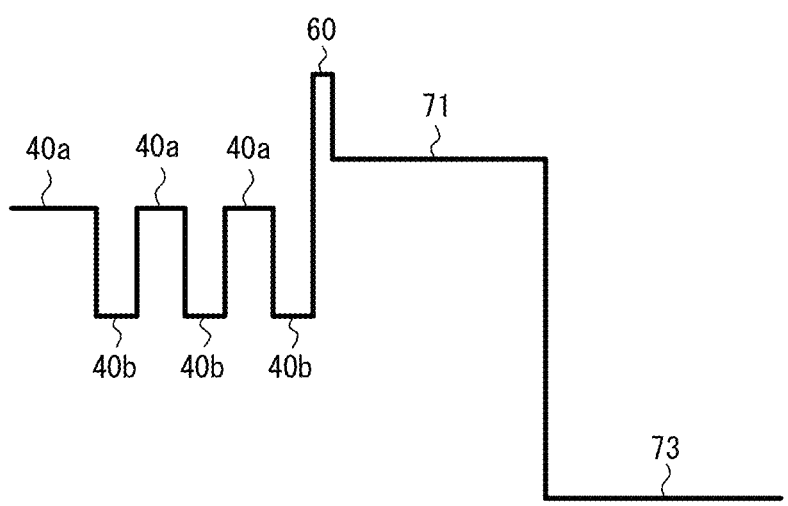
FIG. 3A is a diagram illustrating part of a band structure of a group III semiconductor light-emitting element according to this disclosure illustrating one embodiment.

FIG. 3A is a diagram illustrating an example of the band structure of the conduction band of the group III nitride semiconductor light-emitting element 100 according to this embodiment. In FIG. 3A, the Nth well layer 40b in the laminated body 40 and the AlN guide layer 60 are in contact with each other. In other words, the laminated body 40 and the AlN guide layer 60 are adjacent to each other. Although the reason for the improvement of the element life has not been theoretically clarified, we consider the reason as follows. If the AlN guide layer is excessively thick, holes are not sufficiently injected into the laminated body, and not only the operating voltage increases but also carrier leakage from the laminated body is facilitated. This can cause inefficient carrier consumption such as non-emitting recombination. If carriers can be blocked by a thin layer, hole injection is facilitated. It is thus assumed that, by providing the AlN guide layer 60 having the appropriate thickness, the element life of the group III nitride semiconductor light-emitting element 100 can be improved as well as the light output. The thickness of the AlN guide layer 60 is preferably more than 0.5 nm and less than 2.0 nm. With such thickness, the light output can be increased more reliably. For this purpose, the thickness is more preferably 0.7 nm or more and 1.7 nm or less, and particularly preferably 0.8 nm or more and 1.5 nm or less.

According to this embodiment, a group III nitride semiconductor light-emitting element having both longer element life and higher light output than conventional group III nitride semiconductor light-emitting elements can be provided.

Figure 3B:
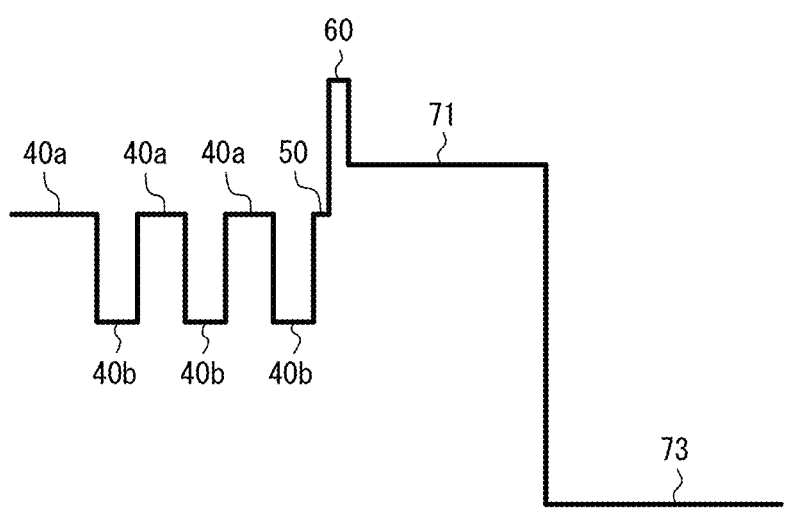
FIG. 3B is a diagram illustrating part of a band structure of a group III semiconductor light-emitting element according to this disclosure illustrating another embodiment.

Preferably, the group III nitride semiconductor light-emitting element 100 further includes, between the Nth well layer 40b on the AlN guide layer 60 side in the laminated body 40 and the AlN guide layer 60, the final barrier layer 50 wider in bandgap than the well layer 40b and narrower in bandgap than the AlN guide layer 60, as illustrated in the schematic diagram in FIG. 2 and the diagram of the band structure in FIG. 3B. In the case of using an $Al_cGa_{1-c}N$ material as the final barrier layer 50, the Al composition ratio c of the final barrier layer 50 is preferably b<c<1, and a≤c<1. In this case, the thickness of the final barrier layer 50 is 1.5 nm or less. The thickness of the final barrier layer 50 is more preferably 0.1 nm or more and 1.0 nm or less, i.e. much thinner than the final barrier layer 50 used in conventional techniques. The element life improving effect by the introduction of the AlN guide layer 60 is ensured if the thickness of the final barrier layer 50 is 1.5 nm or less. However, setting the thickness of the final barrier layer 50 to 1.0 nm or less can further ensure the life improving effect, and also increase the light output of the group III nitride semiconductor light-emitting element. If the thickness 10) of the final barrier layer 50 is more than 1.0 nm, there is a possibility that carriers from the laminated body 40 overflow to a two-dimensional well, at the interface between the final barrier layer 50 and the AlN guide layer 60. This causes a decrease in injection efficiency. In the case where part of the AlGaN alternation layer becomes the AlN guide layer as a result of alteration, if the thickness of the final barrier layer 50 is 0.1 nm or more, one atomic layer, which is unaffected by alteration, remains and thus the well layer 40b is prevented from alteration.

The p layer 70 may have a typical structure, as mentioned above. Preferably, the p layer 70 includes a first p-type group III nitride semiconductor layer and a second p-type group III nitride semiconductor layer in this order. The first p-type group III nitride semiconductor layer is preferably narrower in bandgap than the AlN guide layer 60 and wider in bandgap than the barrier layer 40a. The second p-type group III nitride semiconductor layer is preferably narrower in bandgap than the first p-type group III nitride semiconductor layer. For example, the first p-type group III nitride semiconductor layer may include the p-type electron block layer 71. The first p-type group III nitride semiconductor layer preferably has a single-layer structure composed only of the p-type electron block layer 71. The second p-type group III nitride semiconductor layer may have a multilayer structure including the p-type clad layer 72 and the p-type contact layer 73. The second p-type group III nitride semiconductor layer is preferably composed only of the p-type contact layer 73. The structure of each layer in the p layer 70 is described below.

The electron block layer 71 is adjacent to the AlN guide layer 60, and is a layer narrower in bandgap than the AlN guide layer 60 and wider in bandgap than the barrier layer 40a (i.e. has an Al composition higher than the Al composition a of the barrier layer 40a). The electron block layer 71 is typically used as a layer that, by being provided between the quantum well structure (MQW) functioning as a light-emitting layer and the p-type clad layer, dams electrons and injects the electrons into the light-emitting layer (the well layer in the case of MQW), to enhance electron injection efficiency. In the case where the Al composition of the light-emitting layer is high, the hole concentration of the p layer 70 is low, so that holes tend not to be injected into the light-emitting layer and part of electrons flows to the p layer 70 side. By providing the electron block layer 71, however, such electron flow can be prevented. In this embodiment, the electron block layer 71 adjacent to the AlN guide layer 60 can equally prevent electron flow to the p layer 70 side. Electron injection efficiency can thus be enhanced.

Such an electron block layer 71 may be, for example, an $Al_zGa_{1-z}N$ material (a<z<1). Although depending on the Al composition of the barrier layer 40a, for example the Al composition of the electron block layer 71 is preferably 0.5 or more and 1.0 or less (i.e. a<z<1 and 0.5≤z). This can enhance the efficiency of electron injection into the well layer 40b. For example, the thickness of the whole electron block layer 71 is preferably 6 nm to 60 nm. If the thickness of the electron block layer 71 is less than 6 nm or more than 60 nm, the output decreases significantly. The electron block layer 71 is preferably thicker than the barrier layer 40a. A p-type dopant with which the electron block layer is doped is the same as the p-type dopant in the p layer 70 mentioned above. However, the electron block layer may be doped with a dopant other than p-type according to need, and may partially has an undoped region.

The second p-type group III nitride semiconductor layer may include the p-type electron clad layer 72. While the p-type electron block layer 71 has the above-mentioned Al composition z and is a layer widest in bandgap next to the AlN layer, the clad layer is a layer whose Al composition is lower than the Al composition of the p-type electron block layer by more than 0.1 and higher than the Al composition of the p-type contact layer by more than 0.1. Let y be the Al composition of the p-type clad layer 72, z be the Al composition of the electron block layer 71, and x be the Al composition of the p-type contact layer 73. Then, x+0.1<y<z−0.1. Since p-type AlGaN used in a center wavelength of 300 nm or less allows less current to flow when the Al composition is higher, the Al composition conventionally used as the clad layer tends to be not higher than the Al composition of the barrier layer. Hence, the electron block layer in this description and the clad layer in conventional techniques are distinguished with reference to the Al composition of the barrier layer.

In the group III nitride semiconductor light-emitting element 100 in this embodiment, the p-type clad layer is optional, and may be omitted. The second p-type group III nitride semiconductor layer is preferably composed only of the p-type contact layer 73. In this way, the element life of the group III nitride semiconductor light-emitting element 100 can be improved more reliably. In the case where the p-type clad layer 72 is provided, its thickness may be 2 nm to 300 nm. In this case, the p-type clad layer 72 may be $Al_yGa_{1-y}N$ (0.20≤y<b). The Al composition y is preferably 0.35≤y<b. The p-type clad layer 72 may have a multilayer structure that varies in Al composition, although not illustrated. In such a case, when a p-type clad layer on the light-emitting layer side is referred to as "first p-type clad layer" and a p-type clad layer on the p-type contact layer side as "second p-type clad layer", the Al composition of the first p-type clad layer is preferably higher than the Al composition of the second p-type clad layer.

Preferably, the first p-type group III nitride semiconductor layer and the second p-type group III nitride semiconductor layer are in contact with each other, and the second p-type group III nitride semiconductor layer is composed only of the p-type contact layer 73. In this case, the p-type contact layer 73 may be a p-type $Al_xGa_{1-x}N$ material with an Al composition x of 0≤x≤0.1. The p-type contact layer 73 is a layer for reducing the contact resistance between the p-type electrode 80 formed on its surface and the electron block layer 71, and can sufficiently reduce the contact resistance with the p-type electrode 80. The Al composition x of the p-type contact layer 73 is particularly preferably x=0 (i.e. GaN). A dopant for making the p-type contact layer 73 p-type may be magnesium (Mg), zinc (Zn), or the like. The thickness of the p-type contact layer 73 may be 5 nm or more and 200 nm or less. The p-type contact layer 73 preferably has a multilayer structure that varies in one or more of Al composition, dopant type, dopant concentration, carrier gas type upon formation, and the like, although not illustrated.

Specific examples of the substrate 10, the AlN layer 20, the n-type electrode 80, and the p-type electrode 90 illustrated in FIG. 1 are described below, although these components can be subjected to various modifications. As mentioned earlier, the sapphire substrate 10, the AlN layer 20, the n-type electrode 80, and the p-type electrode 90 illustrated in FIG. 1 in the embodiment of this disclosure do not limit this disclosure.

The substrate 10 of the group III semiconductor light-emitting element 100 may be a sapphire substrate. An AlN template substrate formed by epitaxially growing the AlN layer 20 on the surface of the sapphire substrate may be used. The sapphire substrate may be any sapphire substrate. The sapphire substrate may or may not have off-angle. The crystal axis orientation in the inclination direction in the case where the sapphire substrate has off-angle may be any of an m-axis direction and an a-axis direction. For example, the main surface of the sapphire substrate may be a surface with C-plane being inclined at an off-angle θ of 0.5 degrees. In the case of using the AlN template substrate, the AlN layer on the surface of the sapphire substrate preferably has excellent crystallinity. It is also preferable to provide an undoped AlGaN layer on the surface of the AlN template substrate. The substrate 10 may be an AlN single-crystal substrate.

The n-type electrode 80 may be, for example, a metal composite film including a Ti-containing film and an Al-containing film formed on the Ti-containing film. The thickness, shape, and size of the n-type electrode 80 may be selected as appropriate depending on the shape and size of the light-emitting element. The p-type electrode 90 may be, for example, a metal composite film including an Ni-containing film and an Au-containing film formed on the Ni-containing film. The thickness, shape, and size of the p-type electrode 90 may be selected as appropriate depending on the shape and size of the light-emitting element.

Method of Manufacturing Group III Nitride Semiconductor Light-Emitting Element: Embodiment 1

Embodiment 1 of the method of manufacturing the group III nitride semiconductor light-emitting element 100 according to this disclosure is described below. The manufacturing method according to Embodiment 1 includes: a first step of forming the n-type group III nitride semiconductor layer 30 (hereafter, "n layer 30") (Step 4E in FIG. 4); a second step of forming, on the n layer 30, the group III nitride semiconductor laminated body 40 (hereafter, "laminated body 40") obtained by alternately laminating the barrier layer 40a and the well layer 40b narrower in bandgap than the barrier layer 40a in this order so that the number of barrier layers 40a and the number of well layers 40b are both N (where N is an integer) (Step 4F in FIG. 4); a third step 10) of forming the AlN guide layer 60 having a thickness of 0.5 nm or more and 2.0 nm or less, on the laminated body 40 (Step 4G in FIG. 4); and a fourth step of forming the p-type group III nitride semiconductor layer 70 (hereafter, "p layer 70") on the AlN guide layer 60 (Step 4H in FIG. 4). A particular feature in Embodiment 1 is that, in the third step, the AlN guide layer 60 is epitaxially grown using source gas including trimethylaluminum gas and ammonia gas. Each of the steps is described below with reference to FIG. 4 which is a flowchart according to a preferred example of Embodiment 1, where the description of the same contents as the above is omitted.

First, a sapphire substrate is typically prepared as the substrate 10. An AlN template substrate obtained by forming the AlN layer on the surface 10A of the substrate 10 is preferably used. A commercially available AlN template substrate may be used (Step 4A to Step 4B in FIG. 4). The AlN layer 20 can be formed by a known thin-film growth method such as metalorganic vapor phase epitaxy (metal organic chemical vapor deposition (MOCVD)), molecular beam epitaxy (MBE), or sputtering.

As the Al source of the AlN layer 20, trimethylaluminum (TMA) may be used. As the N source of the AlN layer 20, ammonia ($NH_3$) gas may be used. The AlN layer 20 can be formed by using these source gas with hydrogen gas as carrier gas.

The growth temperature of the AlN layer 20 is not limited, but is preferably 1270° C. or more and 1350° C. or less, and more preferably 1290° C. or more and 1330° C. or less. If the growth temperature of the AlN layer 20 is in this temperature range, the AlN layer 20 exhibits improved crystallinity in a subsequent heat treatment step. The in-chamber growth pressure may be, for example, 5 Torr to 20 Torr. The in-chamber growth pressure is more preferably 8 Torr to 15 Torr.

The mole ratio of group V elements to group III elements (hereafter referred to as "V/III ratio") calculated based on the growth gas flow rates of group V element gas such as $NH_3$ gas and group III element gas such as TMA gas may be, for example, 130 or more and 190 or less. The V/III ratio is more preferably 140 or more and 180 or less. Since there is an optimal V/III ratio depending on the growth temperature and the growth pressure, it is preferable to set the growth gas flow rate as appropriate.

Following this, the AlN layer 20 on the sapphire substrate 10 obtained in the above-mentioned manner is preferably heat-treated at a higher temperature than the growth temperature of the AlN layer 20. This heat treatment step can be performed using a known heat treatment furnace. By such heat treatment, the half-width of the X-ray rocking curve of the (10-12)-plane of the AlN layer 20 can be made to 400 sec or less to achieve high crystallinity (Step 4C in FIG. 4).

Figure 4:
FIG. 4 is a flowchart illustrating Embodiment 1 of a method of manufacturing a group III semiconductor light-emitting element according to this disclosure.
Figure 4:
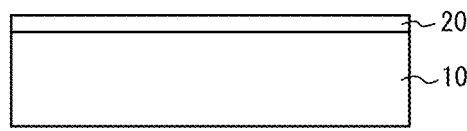
Figure 4:
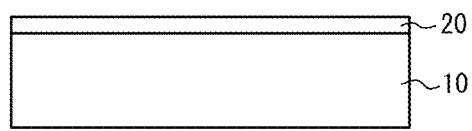
Figure 4:
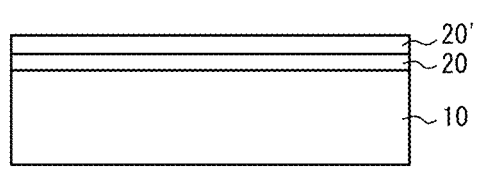
Figure 4:
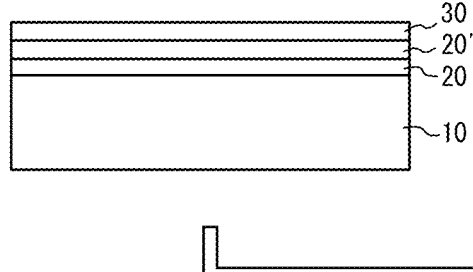
Figure 4:
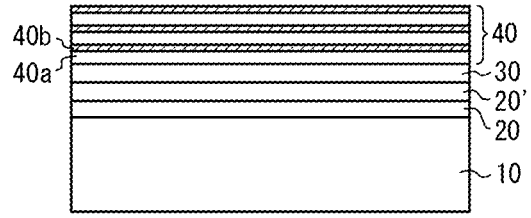
Figure 4:
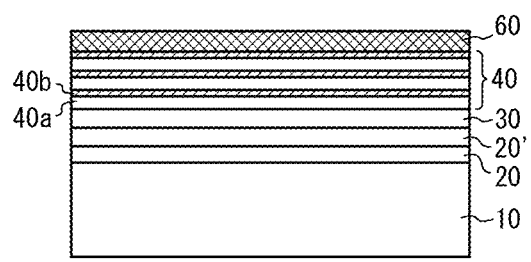
Figure 4:
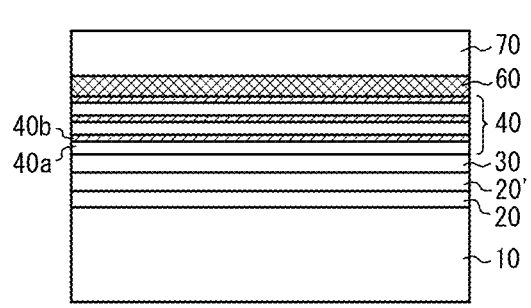
Figure 4:
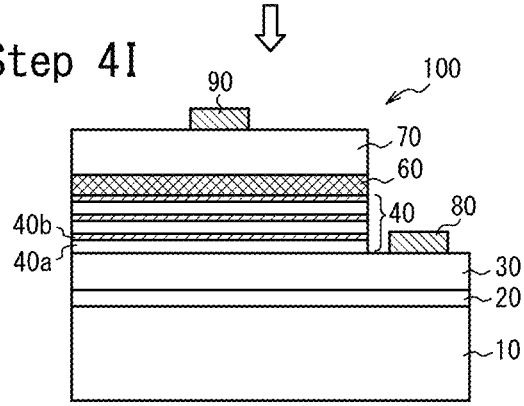

After this, an undoped AlGaN layer 20' is preferably formed on the AlN layer 20, as illustrated in Step 4D in FIG. 4. By using TMA as an Al source, trimethylgallium (TMG) as a Ga source, and $NH_3$ gas as an N source, a layer made of an AlGaN material can be formed. The same applies to the formation of the n layer 30, the laminated body 40, the final barrier layer 50, the AlN guid layer 60, and the p layer 70 described below. These source gases are supplied into the chamber, using hydrogen gas, nitrogen gas, or mixed gas of hydrogen and nitrogen as carrier gas. Typically, hydrogen gas is used as carrier gas. The V/III ratio calculated based on the growth gas flow rates of group V element gas such as $NH_3$ gas and group III element gas such as TMA gas may be, for example, 100 or more and 100000 or less. The V/III ratio is more preferably 300 or more and 30000 or less. Since there is an optimal V/III ratio depending on the growth temperature and the growth pressure, it is preferable to set the growth gas flow rate as appropriate, as in the formation of the AlN layer 20.

Next, the first step of forming the n layer 30 is performed (Step 4E in FIG. 4). The n layer 30 may be formed on the AlN layer 20, and is preferably formed on the undoped AlGaN layer 20'. The n-type dopant is as described above.

Next, the second step of forming the laminated body 40 is performed, as illustrated in Step 4F in FIG. 4. For the adjustment of the Al composition ratio when forming the well layer 40b and the barrier layer 40a, the ratio of the flow rate of the Al source and the flow rate of the Ga source may be changed as appropriate. In the case of forming the laminated body 40 with an AlGaN material, the growth temperature is preferably 1000° C. or more and 1400° C. or less, and more preferably 1050° C. or more and 1350° C. or less.

Next, the third step of forming the AlN guid layer 60 on the laminated body 40 is performed. In Embodiment 1, source gas including trimethylaluminum gas (TMA gas) and ammonia gas ($NH_3$ gas) is used to epitaxially grow the AlN guide layer 60 in this step. To deliberately prevent intrusion of other group III elements such as Ga, the source gas is particularly preferably composed only of trimethylaluminum gas (TMA gas) and ammonia gas ($NH_3$ gas). As the carrier gas, carrier gas having nitrogen as a main component is preferable, and nitrogen gas is more preferable. The growth temperature is preferably 1000° C. or more and 1400° C. or less, and more preferably 1050° C. or more and 1350° C. or less. By selecting the growth time as appropriate, the AlN guide layer 60 having a thickness of 0.5 nm or more and 2.0 nm or less can be obtained.

Next, the fourth step of forming the p layer 70 on the AlN guid layer 60 is performed, as illustrated in Step 4H in FIG. 4. The p layer 70 may include any or all of the p-type electron block layer 71, the p-type clad layer 72, and the p-type contact layer 73, as mentioned above.

The dopant for forming the p layer 70 may be selected as appropriate from Mg, Zn, and the like. Cyclopentadienyl-magnesium ($CP_2Mg$) may be used as an Mg source, and $ZnCl_2$ may be used as a Zn source. In the case of performing doping using a mixture of a plurality of dopants, mixed gas of the dopant sources is supplied into the chamber.

In the case of forming the p-type electron block layer 71 with an $Al_zGa_{1-z}N$ material ($a<z \leq 1$), the p-type electron block layer 71 may be formed using, as the carrier gas, gas having hydrogen as a main component. The source gas includes TMA, TMG, and $NH_3$ gas as mentioned above, and further the gas of the dopant source is selected as appropriate and used. In the case of forming the AlN guid layer 60 using nitrogen gas as the carrier gas and forming the p-type electron block layer 71 using hydrogen as the carrier gas, the carrier gas needs to be switched. In this case, after the formation of the AlN guid layer 60, the supply of TMA gas is interrupted, and the carrier gas is switched from nitrogen to hydrogen. After about 20 sec to 1 min from the switching, TMA gas and TMG gas are supplied to form the electron block layer 71.

In this description, "carrier gas having hydrogen as a main component" denotes carrier gas whose ratio of the volume of hydrogen gas to the volume 10) of the whole carrier gas is 60% or more. The ratio is more preferably 85% or more. Gas having purity commercially available for semiconductor manufacture is applicable. The same definition applies to "carrier gas having nitrogen as a main component". The volume ratio of the carrier gas mentioned here involves gas supplied into the chamber and passing through a space near a wafer, and does not involve gas mainly intended to purge the heater or the chamber inner wall and exhausted without passing through the space near the wafer. In other words, even when a large amount of hydrogen is being flown to the heater or the chamber inner wall and exhausted, if nitrogen is being substantially flown in the vicinity of the wafer, the carrier gas is "carrier gas having nitrogen as a main component".

The growth temperature of the p layer 70 is, although depending on the Al composition ratio, preferably 1000° C. or more and 1400° C. or less, and more preferably 1050° C. or more and 1350° C. or less. The in-chamber growth pressure may be, for example, 10 Torr to 760 Torr. The in-chamber growth pressure is more preferably 20 Torr to 380 Torr. Here, the growth temperature when forming the p-type contact layer 73 having a lower Al composition ratio in the p layer 70 is preferably 800° C. or more and 1400° C. or less, and more preferably 900° C. or more and 1300° C. or less. The in-chamber growth pressure may be, for example, 10 Torr to 760 Torr, and more preferably 20 Torr to 600 Torr. The carrier gas may be hydrogen gas, nitrogen gas, or mixed gas of hydrogen and nitrogen, as mentioned above. Although not illustrated, in the case where the p-type contact layer 73 has a multilayer structure that varies in any one or more of Al composition, dopant type, dopant concentration, carrier gas type upon formation, and the like, the carrier gas on the AlN guid layer 60 side and the carrier gas on the opposite side (i.e. the p-type electrode 90 side) may be respectively hydrogen gas and nitrogen gas, and vice versa. The p-type clad layer 72 may be provided, but is preferably omitted in terms of element life as mentioned above.

Lastly, part of the laminated body 40, the AlN guid layer 60, and the p layer 70 is removed by etching or the like, and the n-type electrode 80 is formed on the exposed n layer 30 and the p-type electrode 90 is formed on the p layer 70, as illustrated in Step 4I in FIG. 4. The group III nitride semiconductor light-emitting element 100 can thus be produced by the manufacturing method according to Embodiment 1 of this disclosure.

Method of Manufacturing Group III Nitride Semiconductor Light-Emitting Element: Embodiment 2

Embodiment 2 of the method of manufacturing the group III nitride semiconductor light-emitting element 100 according to this disclosure is described below. The manufacturing method according to Embodiment 2 includes: a first step of forming the n layer 30; a second step of forming, on the n layer 30, the laminated body 40 obtained by alternately laminating the barrier layer 40a and the well layer 40b narrower in bandgap than the barrier layer 40a in this order so that the number of barrier layers 40a and the number of well layers 40b are both N (where N is an integer); a third step of forming the AlN guide layer 60 having a thickness of 0.5 nm or more and 2.0 nm or less, on the laminated body 40; and a fourth step of forming the p layer 70 on the AlN guide layer 60. The description of the same contents as in Embodiment 1 is omitted.

Figure 5:
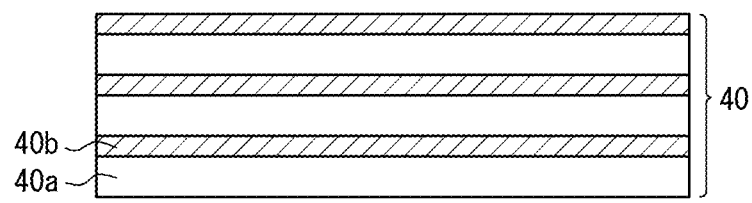
FIG. 5 is a flowchart illustrating Embodiment 2 of a method of manufacturing a group III semiconductor light-emitting element according to this disclosure.
Figure 5:
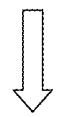
Figure 5:
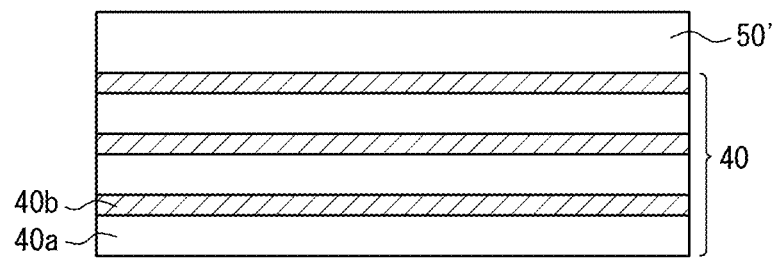
Figure 5:
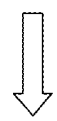
Figure 5:
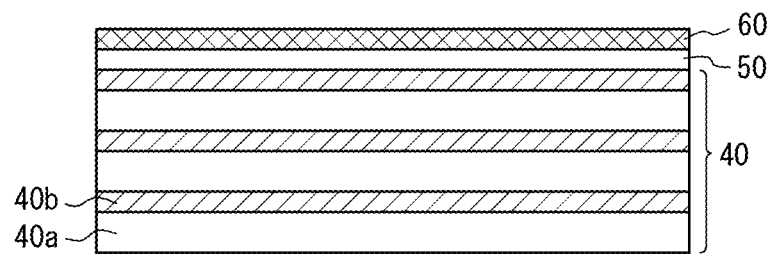

A particular feature in Embodiment 2 different from Embodiment 1 is that, in the third step, an AlGaN alteration layer 50' is epitaxially grown using source gas including trimethylaluminum gas (TMA gas), trimethylgallium gas (TMG gas), and ammonia gas ($NH_3$ gas) in a carrier gas atmosphere having nitrogen as a main component, the epitaxial growth is then interrupted, and the atmosphere is switched to carrier gas having hydrogen as a main component and the AlGaN alteration layer 50' is exposed to the atmosphere, thus altering at least part or the whole of the AlGaN alteration layer 50' to the AlN guide layer 60 and causing the remaining part of the AlGaN alteration layer 50' to be the final barrier layer 50 (see FIG. 5). Here, "alteration" means that the whole or part of the composition of the AlGaN alteration layer 50' changes from AlGaN to AlN after the growth interruption and also the thickness of the AlGaN alteration layer 50' decreases. The alteration is described in more detail below, with reference to Step 5A to Step 5C in FIG. 5.

First, the AlGaN alteration layer 50' is epitaxially grown on the laminated body 40, using source gas including trimethylaluminum gas (TMA gas), trimethylgallium gas (TMG gas), and ammonia gas ($NH_3$ gas) (Step 5A, Step 5B in FIG. 5). As the carrier gas of the AlGaN alteration layer 50', nitrogen, or gas in which nitrogen as a main component is mixed with hydrogen, may be used. The growth temperature, the growth pressure, the V/III ratio, and the like may be typical conditions when forming a layer made of an AlGaN material. The AlGaN alteration layer 50' is formed to be thicker by about 0.5 nm to 1.5 nm than the total thickness of the AlN guide layer 60 and the final barrier layer 50 formed subsequently.

Following this, the epitaxial growth of the AlGaN alteration layer 50' is interrupted, and the AlGaN alteration layer 50' is exposed to a carrier gas atmosphere (e.g. a carrier gas atmosphere having hydrogen as a main component) lower in nitrogen partial pressure than that when growing the alteration layer. In more detail, the supply of TMA gas and TMG gas as group 20) III element source gas is stopped and, while supplying ammonia gas, the AlGaN alteration layer 50' is exposed to hydrogen as the carrier gas. In the case where nitrogen gas is used as the carrier gas when forming the AlGaN alteration layer 50', the carrier gas is switched from nitrogen to hydrogen. Here, it is preferable to, after switching the carrier gas from nitrogen to hydrogen, adjust the ratio of ammonia gas and hydrogen gas to further decrease the nitrogen partial pressure according to need. By stopping the supply of group III element source gas and exposing the AlGaN alteration layer 50' to hydrogen gas to decrease the nitrogen partial pressure, the surface part of the AlGaN alteration layer 50' is altered to AlN to serve as the AlN guide layer 60, and the remaining part maintains the Al composition ratio of the AlGaN alteration layer 50' and serves as the final barrier layer 50.

Although depending on the time of exposure to hydrogen gas, we experimentally confirmed that the thickness of the AlN guide layer 60 formed is about 0.5 nm to 1.5 nm, and the total thickness of the AlN guide layer 60 and the final barrier layer 50 formed is thinner than the AlGaN alteration layer 50' by about 0.5 nm to 1.5 nm. In detail, upon alteration to the AlN guide layer, the AlGaN alteration layer 50' is at least partially removed. This seems to be because Ga in the surface part of the AlGaN alteration layer 50' comes out upon exposure to hydrogen gas. The time of exposure to hydrogen while stopping the supply of group III element source gas (i.e. growth interruption time) is not limited, but is preferably such a time that does not affect the well layer. Depending on the respective target thicknesses of the AlN guide layer 60 and the final barrier layer 50, the time of exposure is preferably about 15 sec to 90 sec, and more preferably about 45 sec to 75 sec.

In the third step, it is preferable to alter the whole AlGaN alteration layer 50' to the AlN guide layer 60. In this way, variation in element life among a plurality of group III nitride semiconductor light-emitting elements cut out of the wafer can be reduced. When the design thickness of the AlGaN alteration layer 50' is set to 0.5 nm or more and 2.0 nm or less, the whole AlGaN alteration layer 50' can be altered to the AlN guide layer 60. The thickness of the AlN guide layer 60 formed in this case is 0.5 nm or more and 1.0 nm or less. Here, if the alteration extends to the region of the well layer 40b, the output decreases. Accordingly, the output tends to vary more widely than in Embodiment 1.

In the case of altering only part of the AlGaN alteration layer 50' to the AlN guide layer 60 so that the remaining part serves as the final barrier layer 50 in the third step, the design thickness of the AlGaN alteration layer 50' is preferably set so that the thickness of the final barrier layer 50 is 1.0 nm or less. When the design thickness of the AlGaN alteration layer 50' is set to more than 2.0 nm and 3.0 nm or less, the thickness of the AlN guide layer 60 formed is 0.8 nm or more and 1.2 nm or less, and the thickness of the final barrier layer is 1.0 nm or less. The thickness of the final barrier layer 50 is preferably 1.0 nm or less, as mentioned above.

The group III nitride semiconductor light-emitting element 100 according to this disclosure can be produced by the manufacturing method of any of Embodiments 1 and 2 described above. These embodiments of the manufacturing methods are merely exemplary embodiments for manufacturing the group III nitride semiconductor light-emitting element 100 according to this disclosure, and the group III nitride semiconductor light-emitting element 100 may be produced by other embodiments. The manufacturing method in Embodiment 1 enables more accurate adjustment of the thickness of the AlN guide layer than the manufacturing method in Embodiment 2, and so is preferable.

More detailed description is given below, using examples. This disclosure is, however, not limited to the following examples.

EXAMPLES

Experimental Example 1

A group III nitride semiconductor light-emitting element in experimental example 1 was produced according to the flowchart in FIG. 4. First, a sapphire substrate (diameter: 2 inch, thickness: 430 μm, plane orientation: (0001), m-axis direction off-angle θ: 0.5 degrees, terrace width: 100 nm, step height: 0.20 nm) was prepared (Step 4A in FIG. 4). Next, an AlN layer having a central film thickness of 0.60 μm (average film thickness: 0.61 μm) was grown on the sapphire substrate by MOCVD, to obtain an AlN template substrate (Step 4B in FIG. 4). The growth temperature of the AlN layer was 1300° C., the in-chamber growth pressure was 10 Torr, and the growth gas flow rates of ammonia gas and TMA gas were set so that the V/III ratio was 163. The flow rate of group V element gas ($NH_3$) was 200 sccm, and the flow rate of group III element gas (TMA) was 53 sccm. Regarding the film thickness of the AlN layer, the film thickness at each of 25 locations distributed at equal intervals including the center in in the wafer plane was measured using an optical interference film thickness measurement device (Nanospec M6100A made by Nanometrics Inc.).

The AlN template substrate was then introduced into a heat treatment furnace. After reducing the pressure to 10 Pa, nitrogen gas was purged to ordinary pressure, thus forming a nitrogen gas atmosphere in the furnace. After this, the temperature in the furnace was increased to heat-treat the AlN template substrate (Step 4C in FIG. 4). The heating temperature was 1650° C., and the heating time was 4 hr.

Next, an undoped $Al_{0.7}Ga_{0.3}N$ layer made of $Al_{0.7}Ga_{0.3}N$ and having a thickness of 1.32 μm was formed as an undoped AlGaN layer, by MOCVD (Step 4D in FIG. 4). An n-type $Al_{0.62}Ga_{0.38}N$ layer made of $Al_{0.62}Ga_{0.38}N$, doped with Si, and having a thickness of 1.69 μm was then formed on the AlGaN layer, as an n-type semiconductor layer. Following this, an n-type $Al_{0.56}Ga_{0.44}N$ layer Si-doped and having a thickness of 0.36 μm was formed (Step 4E in FIG. 4). As a result of SIMS analysis, the Si concentrations of the n-type $Al_{0.62}Ga_{0.38}N$ layer and the n-type $Al_{0.56}Ga_{0.44}N$ layer were both $1.0 \times 10^{19}$ atoms/cm$^3$.

Next, $Al_{0.65}Ga_{0.35}N$ having a thickness of 24 nm, serving as an n-type guide layer and a barrier layer, was formed on the n-type $Al_{0.56}Ga_{0.44}N$ layer. Following this, a well layer made of $Al_{0.45}Ga_{0.55}N$ and having a thickness of 2.4 nm and a barrier layer made of $Al_{0.65}Ga_{0.35}N$ and having a thickness of 5.8 nm were alternately formed so that the number of layers was 2 each, and further a well layer made of $Al_{0.45}Ga_{0.55}N$ and having a thickness of 2.4 nm was formed (Step 4F in FIG. 4) (i.e. the number N of well layers and the number N of barrier layers: N=3). The barrier layers were formed by doping with Si.

An undoped AlGaN alteration layer made of $Al_{0.65}Ga_{0.35}N$ and having a thickness of 2 nm was then formed on the third well layer, at an in-furnace pressure (growth pressure) of 52 Torr using nitrogen gas as carrier gas. Next, the supply of TMA gas and TMG gas was stopped. While keeping supplying ammonia gas, the supply of nitrogen as carrier gas was stopped and hydrogen was supplied. After 35 sec from the start of the hydrogen supply, the ratio of hydrogen and ammonia was changed from 1:1 to 2.13:1. Thus, in a state where the in-furnace pressure was increased to 75 Torr and the nitrogen partial pressure was further decreased, the AlGaN alteration layer was exposed for 30 sec, to alter the AlGaN alteration layer having a thickness of 2 nm to an AlN guide layer having a thickness of 1 nm. After this, while keeping using hydrogen as the carrier gas, TMA gas and TMG gas as group III element source gas were supplied again, to form a p-type electron block layer made of $Al_{0.68}Ga_{0.32}N$, doped with Mg, and having a thickness of 40 nm.

Next, after switching the carrier gas to nitrogen gas, a p-type contact layer made of GaN, doped with Mg, and having a layer thickness of 175 nm was formed. In the thickness of 175 nm, a 25 nm thickness portion in contact with the electrode was made into a layer having a high Mg concentration, by decreasing the flow rate of TMG gas to increase the Mg existence probability and also decreasing the growth speed (Step 4H in FIG. 4). As a result of SIMS analysis, the Mg concentration of the p-type contact layer in the 150 nm thickness portion on the p-type electron block layer side was $3.0 \times 10^{19}$ atoms/cm$^3$, and the Mg concentration of the remaining 30 nm thickness portion formed to have a high Mg concentration was $1.2 \times 10^{20}$ atom/cm$^3$.

A mask was then formed on the p-type contact layer, and mesa etching was performed by dry etching, to expose part of the n-type $Al_{0.56}Ga_{0.44}N$ layer. After this, a p-type electrode made of Ni/Au was formed on the p-type contact layer, and an n-type electrode made of Ti/Al was formed on the exposed n-type $Al_{0.56}Ga_{0.44}N$ layer. In the p-type electrode, the thickness of Ni was 50 Å, and the thickness of Au was 1500 Å. In the n-type electrode, the thickness of Ti was 200 Å, and the thickness of Al was 1500 Å. Lastly, contact annealing (RTA) was performed at 550° C., to form the electrodes (Step 4I in FIG. 4).

Figure 6:
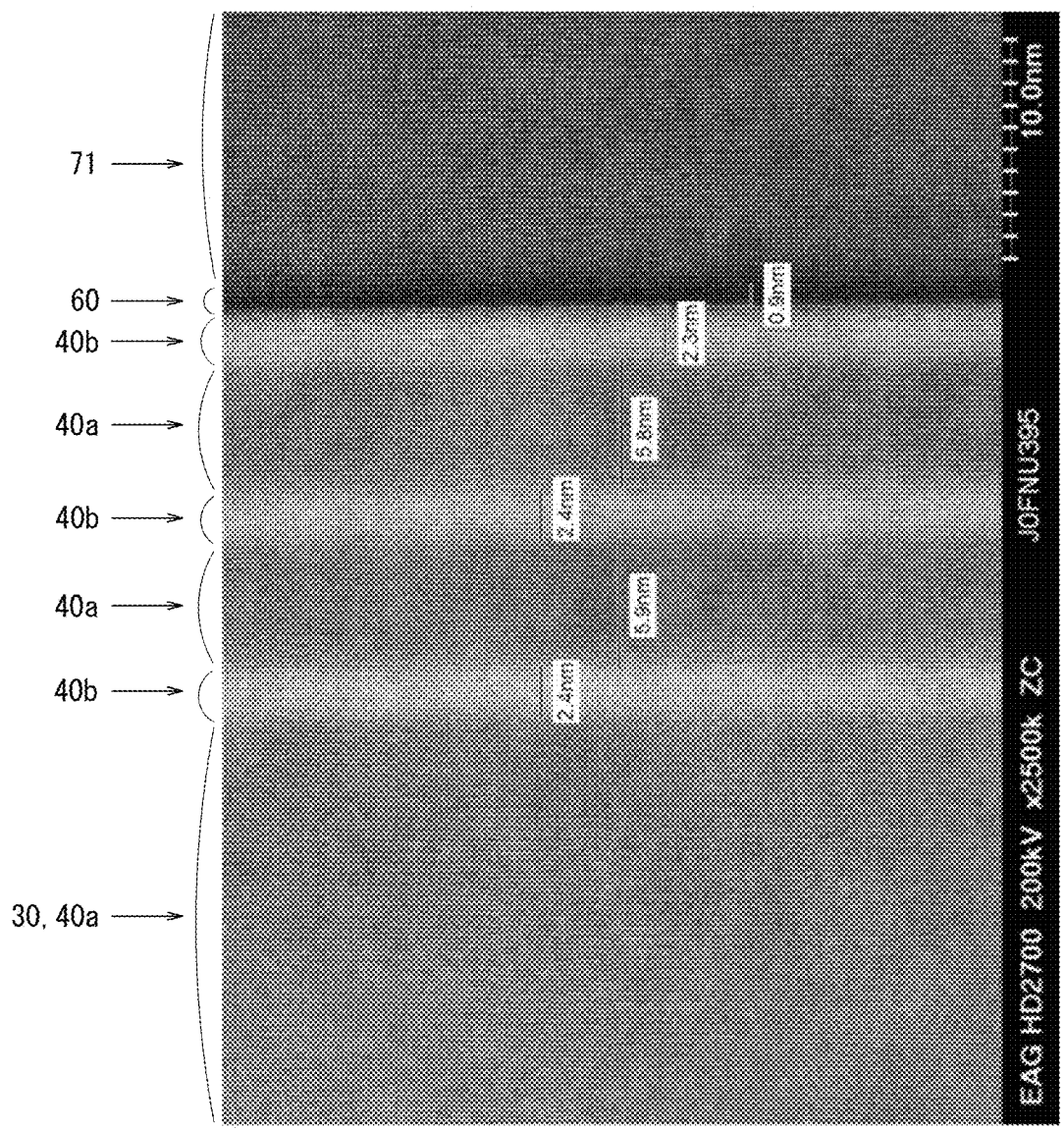
FIG. 6 is a TEM section photograph of a group III semiconductor light-emitting element in experimental example 1.

Table 1 lists the structure of each of the layers from the undoped AlGaN layer to the p-type contact layer above the AlN layer 20 in the group III nitride semiconductor light-emitting element produced in the above-mentioned manner. FIG. 6 illustrates a TEM section photograph of part of the group III nitride semiconductor light-emitting element, as a typical example. The actually measured thickness of each layer in Table 1 was obtained from the TEM section photograph, and the value of the Al composition ratio of each layer was obtained by measurement using energy dispersive spectroscopy (EDS).

If each layer has sufficient thickness, identification can be made using SEM-EDS. If each layer is thin as in the case of the AlN guide layer, the well layer, and the barrier layer, identification can be made using TEM-EDS.

TABLE 1

| layer | thickness (actually measured value) | Al composition ratio |
|---|---|---|
| p-type contact layer | 140 nm | 0% |
| p-type electron block layer | 39 nm | 68% |
| AlN layer | 0.9 nm | 100% (note 2) |
| (note 1: AlGaN alteration layer) | (note 1) | |
| well layer (third layer) | 2.3 nm | 45% |
| barrier layer (third layer) | 5.8 nm | 65% |
| well layer (second layer) | 2.4 nm | 45% |
| barrier layer (second layer) | 5.9 nm | 65% |

TABLE 1-continued

| layer | thickness (actually measured value) | Al composition ratio |
|---|---|---|
| well layer (first layer) | 2.4 nm | 45% |
| barrier layer (first layer)/n-type guide layer | 24 nm | 65% |
| n-type AlGaN layer (second layer) | 361 nm | 56% |
| n-type AlGaN layer (first layer) | 1690 nm | 62% |
| undoped AlGaN layer | 1320 nm | 70% | note 1: although the design thickness of the AlGaN alteration layer was 2 nm, alteration to the AlN guide layer having a thickness of 0.9 nm occurred, and no layer with an Al composition ratio of 65% was observed.
note 2: The Al composition ratio of the AlGaN alteration layer before alteration was 65%.

As illustrated in FIG. 6, in this group III nitride semiconductor light-emitting element, the AlGaN alteration layer having a design thickness of 2 nm was altered to the AlN guide layer having a thickness of 0.9 nm. At the position of the formation of the AlGaN alteration layer, no $Al_{0.65}Ga_{0.35}N$ layer was observed. The same test was conducted with different thickness of the AlGaN alteration layer, and a TEM section photograph was obtained. As a result, a 1 nm surface part (average value) of the AlGaN alteration layer was altered to the AlN guide layer, and the total thickness of the AlN guide layer and the final barrier layer after the alteration was 1 nm thinner than the thickness of the AlGaN alteration layer on average.

Experimental Example 2

(Sample 1)
A group III nitride semiconductor light-emitting element of sample 1 was produced under the same conditions as experimental example 1, except that the AlN guide layer was formed as follows. When forming the AlN guide layer, TMA gas was used as the group III element source gas, and the thickness was set to 1 nm. Without adding a dopant, an i-type AlN guide layer was formed. The carrier gas and the growth pressure were the same as those in experimental example 1, and the carrier gas switching to the p-type electron block layer was performed under the same conditions.

(Sample 2)
A group III nitride semiconductor light-emitting element of sample 2 was produced in the same way as sample 1, except that the AlN guide layer was formed with a thickness of 0.5 nm.

(Sample 3)
A group III nitride semiconductor light-emitting element of sample 3 was produced in the same way as sample 1, except that the AlN guide layer was formed with a thickness of 2.0 nm.

(Sample 4)
A group III nitride semiconductor light-emitting element of sample 4 was produced under the same conditions as experimental example 1, with the design thickness of the AlGaN alteration layer being 2.0 nm.

(Sample 5)
A group III nitride semiconductor light-emitting element of sample 5 was produced in the same way as sample 4, except that the design thickness of the AlGaN alteration layer was 1.0 nm.

(Sample 6)
A group III nitride semiconductor light-emitting element of sample 6 was produced in the same way as sample 4, except that the design thickness of the AlGaN alteration layer was 3.0 nm.

(Sample 7)
A group III nitride semiconductor light-emitting element of sample 7 was produced in the same way as sample 4, except that the design thickness of the AlGaN alteration layer was 4.0 nm.

(Sample 8)
A group III nitride semiconductor light-emitting element of sample 8 was produced in the same way as sample 4, except that the design thickness of the AlGaN alteration layer was 5.0 nm.

(Sample 9)
A group III nitride semiconductor light-emitting element of sample 9 was produced in the same way as sample 8, except that the composition of the AlGaN alteration layer was $Al_{0.55}Ga_{0.45}N$.

(Sample 10)
A group III nitride semiconductor light-emitting element of sample 10 was produced in the same way as sample 9, except that the design thickness of the AlGaN alteration layer was 20.0 nm.

(Sample 11)
A group III nitride semiconductor light-emitting element of sample 11 was produced in the same way as sample 1, except that neither the AlN guide layer nor the AlGaN alteration layer was formed.

(Sample 12)
A group III nitride semiconductor light-emitting element of sample 12 was produced in the same way as sample 1, except that nitrogen gas was used as the carrier gas when forming the p-type electron block layer.

(Sample 13)
A group III nitride semiconductor light-emitting element of sample 13 was produced in the same way as sample 4, except that growth interruption was not performed and nitrogen gas was used as the carrier gas when forming the p-type electron block layer.

(Sample 14)
A group III nitride semiconductor light-emitting element of sample 14 was produced in the same way as sample 1, except that the AlN guide layer was formed with a thickness of 3.0 nm.

Table 2 lists the formation conditions of the AlN guide layer and the AlGaN alteration layer in samples 1 to 15.

TABLE 2

| sample No. | Al composition ratio of alteration layer (%) | alteration | carrier gas switching | design thickness of AlGaN alteration layer (nm) | thickness of AlN guide layer (nm) | thickness of final barrier layer (nm) | level |
|---|---|---|---|---|---|---|---|
| sample 1 | — | no alteration | $N_2$->$H_2$ | — | 1.0 | — | example |
| sample 2 | — | no alteration | $N_2$->$H_2$ | — | 0.5 | — | example |
| sample 3 | — | no alteration | $N_2$->$H_2$ | — | 2.0 | — | example |

TABLE 2-continued

| sample No. | Al composition ratio of alteration layer (%) | alteration | carrier gas switching | design thickness of AlGaN alteration layer (nm) | tickness of AlN guide layer (nm) | thickness of final barrier layer (nm) | level |
|---|---|---|---|---|---|---|---|
| sample 4 | 65 | alteration | N$_2$->H$_2$ | 2.0 | 1.0 | — | example |
| sample 5 | 65 | alteration | N$_2$->H$_2$ | 1.0 | 0.3 | — | comparative example |
| sample 6 | 65 | alteration | N$_2$->H$_2$ | 3.0 | 1.0 | 1.0 | example |
| sample 7 | 65 | alteration | N$_2$->H$_2$ | 4.0 | 1.0 | 2.0 | example |
| sample 8 | 65 | alteration | N$_2$->H$_2$ | 5.0 | 1.0 | 3.0 | example |
| sample 9 | 55 | alteration | N$_2$->H$_2$ | 5.0 | 1.0 | 3.0 | example |
| sample 10 | 55 | Alteration | N$_2$->H$_2$ | 20.0 | 1.0 | 18.0 | example |
| sample 11 | — | — | — | — | — | — | comparative example |
| sample 12 | — | no alteration | N$_2$->H$_2$ | — | 1.0 | — | example |
| sample 13 | — | no alteration | N$_2$->H$_2$ | — | 0 | — | comparative example |
| sample 14 | — | no alteration | N$_2$->H$_2$ | — | 3.0 | — | comparative example |

(Evaluation 1: Evaluation of Thickness)

A TEM section photograph of the group III nitride semiconductor light-emitting element of each of samples 1 to 14 produced was obtained. The thickness of each of the AlN guide layer and the final barrier layer was measured, and whether or not alteration to the AlN guide layer occurred was determined. In the thickness measurement, 3 to 10 group III nitride semiconductor light-emitting elements were cut out of a wafer formed according to the production conditions of each of samples 1 to 14, and observed. Table 2 lists whether or not alteration occurred, and the average values of the thickness of the AlN guide layer and the thickness of the final barrier layer.

(Evaluation 2: Evaluation of EL Output)

Figure 7A:
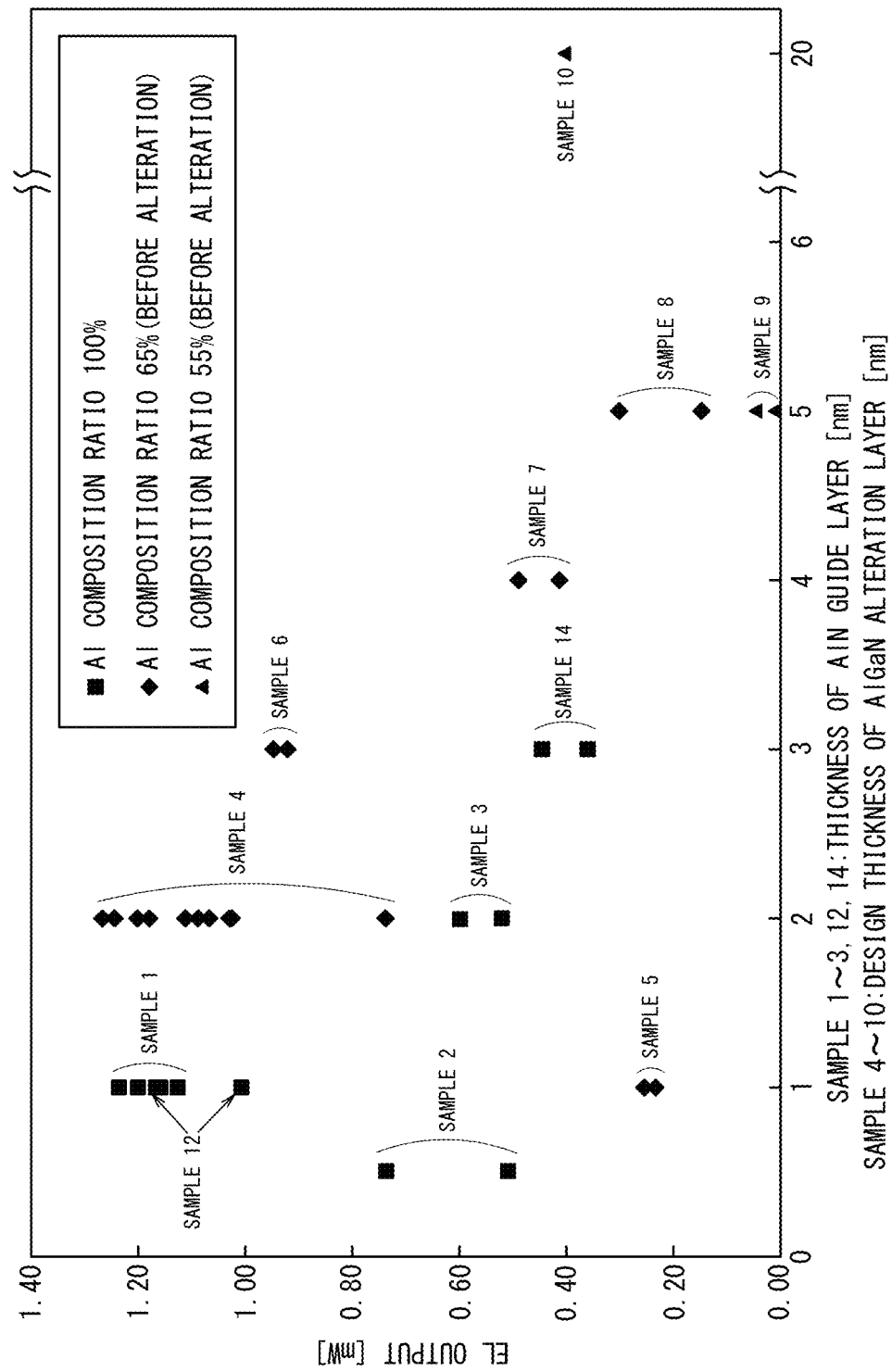
FIG. 7A is a graph illustrating the EL output corresponding to the thickness of the AlN guide layer in each of samples 1 to 3, 12, and 14 and the design thickness of the AlGaN alteration layer in each of samples 4 to 10 in experimental example 2.
Figure 7B:
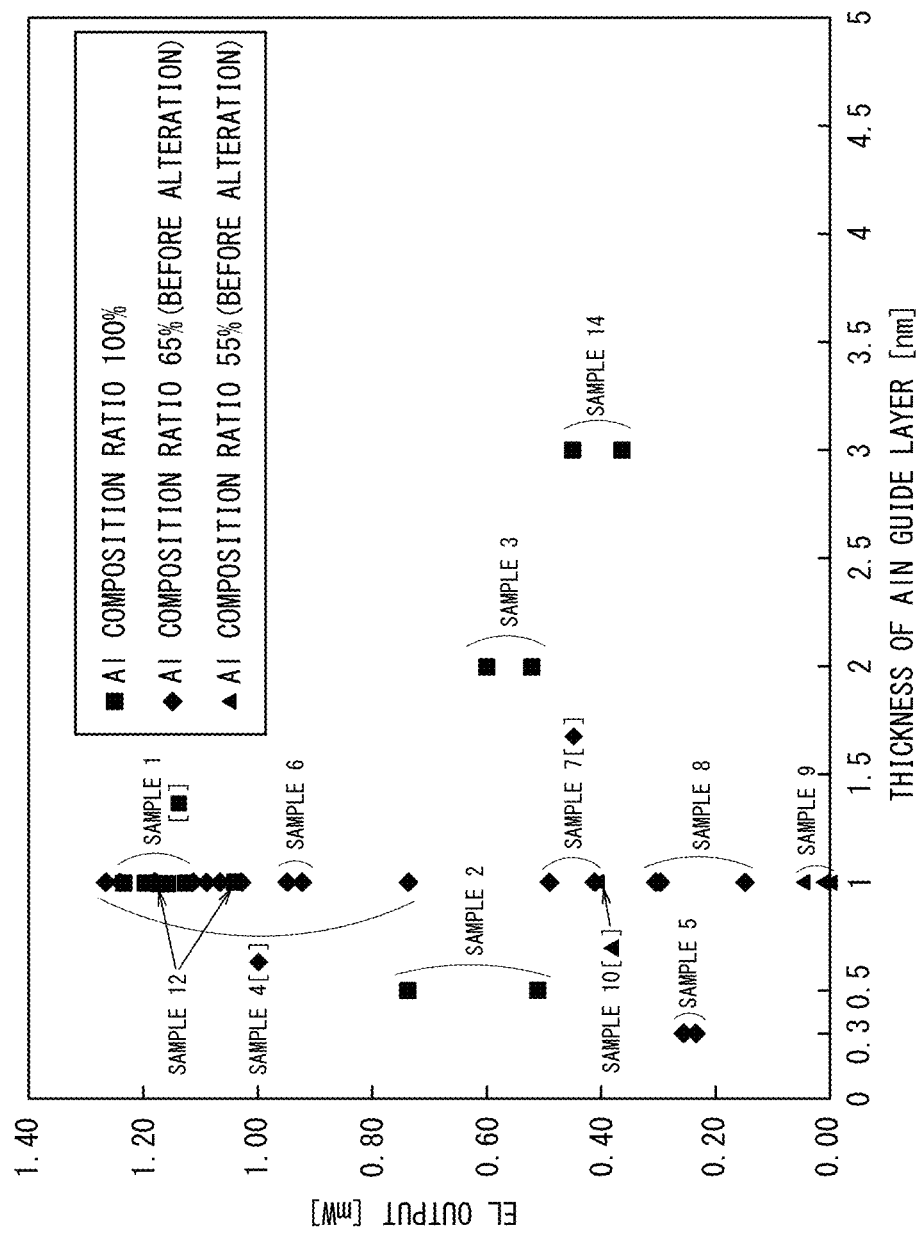
FIG. 7B is a graph illustrating the EL output corresponding to the thickness of the AlN guide layer in each of samples 1 to 10, 12, and 14 in experimental example 2.

To determine the light output immediately after the production of the group III nitride semiconductor light-emitting element of each of samples 1 to 14, EL output with a current of 10 mA was measured using a multi-channel spectroscope (C10082CAH made by Hamamatsu Photonics K.K.). FIGS. 7A and 7B illustrate the measurement results of samples 1 to 10, 12, and 14. In FIG. 7B, the measurement results in FIG. 7A are indicated as the EL output with respect to the measured thickness of the obtained AlN guide layer, based on the foregoing evaluation 1. Samples 11 and 13 had no light emission, and so are not illustrated.

(Evaluation 3: Evaluation of Element Life)

For sample 1 whose EL output was stably high in evaluation 2, the light output Po (mW) of the produced group III nitride semiconductor light-emitting element of flip-chip type with a current of 20 mA was measured using an integrating sphere, and also the residual output after conduction for 1000 hr ((output after conduction for 1000 hr)/(initial light output)) was measured. The measured residual output was 85% with respect to the initial output. The residual output was equally measured for each of samples 4 and 10 whose EL output was about as high as sample 1 in evaluation 2. The respective measurement results were 83% to 88%, and 60%.

These evaluations 1 to 3 revealed the following.

As indicated by the results of evaluation 1, in the case of forming the AlN guide layer with an Al composition ratio of 100% directly on the last well layer, the alteration and thinning of the AlGaN alteration layer seen in experimental example 1 did not occur, and the thickness was unchanged. In samples 4 to 11, on the other hand, a 1.0 nm surface part (average value) of the AlGaN alteration layer was altered to AlN, thus forming the AlN guide layer. Here, the thickness of the whole AlGaN alteration layer decreased by 1.0 nm on average, and the remaining part became the final barrier layer while maintaining the Al composition of the AlGaN alteration layer.

As can be understood from the results of evaluation 2, to increase the EL output, the thickness of the AlN guide layer is preferably more than 0.5 nm and less than 2.0 nm. In the case of providing the final barrier layer, the thickness of the final barrier layer is preferably 1.0 nm or less. Moreover, the EL output can be improved when the final barrier layer has a wider bandgap than the barrier layer. As can be understood from the results of evaluation 3, a sample having appropriate thicknesses of the AlN guide layer and the AlGaN alteration layer is a light-emitting element with long element life. When comparing samples 1 and 4, EL output variation among wafers in the same lot is smaller in the case of forming the AlN guide layer directly on the last well layer than in the case of forming the AlN guide layer through alteration. Moreover, greater EL output variation of sample 4 than sample 6 suggests that the formation of the AlN guide layer through alteration is preferably performed in a period up to a little before the final barrier layer is completely altered. The EL output is expected to decrease if alteration extends deep into the well layer over the final barrier layer.

In samples 12 and 14, no light was emitted. This is probably because, in the case where the thickness of the AlN guide layer is 0 nm (i.e. the AlN guide layer is not formed), the well layer is damaged. In samples 1 and 13, on the other hand, even when the p-type electron block layer was formed without changing the carrier gas after forming the AlN guide layer, high output was observed. This demonstrates the need to form the AlN guide layer having appropriate thickness between the well layer and the p-type electron block 30) layer, regardless of the growth conditions of the p-type electron block layer.

Experimental Example 3

(Sample 21)

A group III nitride semiconductor light-emitting element of sample 21 was produced in the same way as sample 4, except that a p-type clad layer (thickness: 50 nm) made of Al$_{0.35}$Ga$_{0.65}$N and doped with Mg was formed between the p-type electron block layer and the p-type contact layer.

(Sample 22)

A group III nitride semiconductor light-emitting element of sample 22 was produced in the same way as sample 10, except that a p-type clad layer (thickness: 50 nm) was formed between the p-type electron block layer and the p-type contact layer under the same conditions as sample 21.

The EL output and element life of the group III nitride semiconductor light-emitting elements of samples 21 and 22 were evaluated as in the foregoing evaluations 2 and 3. Table 3 lists the results of samples 21 and 22, as well as samples 4 and 10.

TABLE 3

| sample No. | p-type clad layer | Al composition ratio of alteration layer (%) | thickness of AlN guide layer (nm) | thickness of final barrier layer (nm) | relative output after 1000 hr (%) | EL output immediately after production (mW) |
|---|---|---|---|---|---|---|
| sample 4 | not provided | 65 | 1.0 | — | 83 to 88 | 1.3 |
| sample 21 | provided | 65 | 1.0 | — | 50 | 1.3 |
| sample 10 | not provided | 55 | 1.0 | 18.0 | 60 | 0.4 |
| sample 22 | provided | 55 | 1.0 | 18.0 | 50 | 1.0 |

As can be understood from Table 3, by providing the p-type clad layer, the EL output was able to be increased in some cases, but a decrease in element life ensued. Therefore, the p-type clad layer is preferably omitted in terms of element life.

INDUSTRIAL APPLICABILITY

It is thus possible to provide a group III nitride semiconductor light-emitting element having longer element life than conventional group III nitride semiconductor light-emitting elements and a method of manufacturing the same.

REFERENCE SIGNS LIST 10 substrate
10A main surface of substrate
20 AlN layer
30 n-type semiconductor layer
40 laminated body
40a barrier layer
40b well layer
50 final barrier layer
50' AlGaN alteration layer
60 AlN guide layer
70 p-type semiconductor layer
71 p-type electron block layer
72 p-type clad layer
73 p-type contact layer
80 n-type electrode
90 p-type electrode
100 group III nitride semiconductor element

The invention claimed is:

1. A group III nitride semiconductor light-emitting element comprising, in the following order:
    an n-type group III nitride semiconductor layer;
    a group III nitride semiconductor laminated body obtained by alternately laminating a barrier layer having a thickness of 3 nm to 30 nm and a well layer narrower in bandgap than the barrier layer in the stated order so that the number of barrier layers and the number of well layers are both N, where N is an integer;
    a guide layer made of AlN formed with the group III element Al composition ratio being 100%; and
    a p-type group III nitride semiconductor layer,
    wherein the guide layer has a thickness of 0.7 nm or more and 1.7 nm or less,
    a final barrier layer wider in bandgap than the well layer and narrower in bandgap than the guide layer is further provided between an Nth well layer in the group III nitride semiconductor laminated body and the guide layer, the final barrier layer having a thickness of 1.5 nm or less,
    the p-type group III nitride semiconductor layer includes a first p-type group III nitride semiconductor layer and a second p-type group III nitride semiconductor layer in the stated order,
    the first p-type group III nitride semiconductor layer is narrower in bandgap than the guide layer, and wider in bandgap than the barrier layer,
    the second p-type group III nitride semiconductor layer is narrower in bandgap than the first p-type group III nitride semiconductor layer, and
    the first p-type group III nitride semiconductor layer and the second p-type group III nitride semiconductor layer are in contact with each other, and the second p-type group III nitride semiconductor layer is composed only of a p-type contact layer.

2. The group III nitride semiconductor light-emitting element according to claim 1,
    wherein the guide layer is i-type.

3. The group III nitride semiconductor light-emitting element according to claim 1,
    wherein the final barrier layer has a thickness of 0.1 nm or more and 1.0 nm or less.

4. The group III nitride semiconductor light-emitting element according to claim 2,
    wherein the final barrier layer has a thickness of 0.1 nm or more and 1.0 nm or less.

5. The group III nitride semiconductor light-emitting element according to claim 1,
    wherein the Al composition of the first p-type group III nitride semiconductor layer is 0.5 or more and 1.0 or less, and the Al composition of the p-type contact layer is 0 or more and 0.1 or less.

6. The group III nitride semiconductor light-emitting element according to claim 2,
    wherein the Al composition of the first p-type group III nitride semiconductor layer is 0.5 or more and 1.0 or less, and the Al composition of the p-type contact layer is 0 or more and 0.1 or less.

7. The group III nitride semiconductor light-emitting element according to claim 3,
wherein the Al composition of the first p-type group III nitride semiconductor layer is 0.5 or more and 1.0 or less, and the Al composition of the p-type contact layer is 0 or more and 0.1 or less.

8. The group III nitride semiconductor light-emitting element according to claim 4,
wherein the Al composition of the first p-type group III nitride semiconductor layer is 0.5 or more and 1.0 or less, and the Al composition of the p-type contact layer is 0 or more and 0.1 or less.

9. A method of manufacturing a group III nitride semiconductor light-emitting element, the method comprising:
a first step of forming an n-type group III nitride semiconductor layer;
a second step of forming, on the n-type group III nitride semiconductor layer, a group III nitride semiconductor laminated body obtained by alternately laminating a barrier layer and a well layer narrower in bandgap than the barrier layer in the stated order so that the number of barrier layers and the number of well layers are both N, where N is an integer;
a third step of forming an AlN guide layer having a thickness of 0.7 nm or more and 1.7 nm or less, directly on the group III nitride semiconductor laminated body; and
a fourth step of forming a p-type group III nitride semiconductor layer on the AlN guide layer,
wherein, in the third step, the AlN guide layer is epitaxially grown using source gas including trimethylaluminum gas and ammonia gas,
the p-type group III nitride semiconductor layer includes a first p-type group III nitride semiconductor layer and a second p-type group III nitride semiconductor layer in the stated order,
the first p-type group III nitride semiconductor layer is narrower in bandgap than the AlN guide layer, and wider in bandgap than the barrier layer,
the second p-type group III nitride semiconductor layer is narrower in bandgap than the first p-type group III nitride semiconductor layer,
the first p-type group III nitride semiconductor layer and the second p-type group III nitride semiconductor layer are in contact with each other, and the second p-type group III nitride semiconductor layer is composed only of a p-type contact layer, and
an Nth well layer in the group III nitride semiconductor laminated body and the AlN guide layer are in contact with each other.

10. The method of manufacturing a group III nitride semiconductor light-emitting element according to claim 9,
wherein the AlN guide layer is i-type.

11. The method of manufacturing a group III nitride semiconductor light-emitting element according to claim 9,
wherein the Al composition of the first p-type group III nitride semiconductor layer is 0.5 or more and 1.0 or less, and the Al composition of the p-type contact layer is 0 or more and 0.1 or less.

12. The method of manufacturing a group III nitride semiconductor light-emitting element according to claim 10,
wherein the Al composition of the first p-type group III nitride semiconductor layer is 0.5 or more and 1.0 or less, and the Al composition of the p-type contact layer is 0 or more and 0.1 or less.

* * * * *